(12) United States Patent
Utsuno

(10) Patent No.: US 7,535,269 B2
(45) Date of Patent: May 19, 2009

(54) MULTIPLIER CIRCUIT

(75) Inventor: Kikuo Utsuno, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/763,492

(22) Filed: Jun. 15, 2007

(65) Prior Publication Data

US 2008/0309398 A1  Dec. 18, 2008

(51) Int. Cl.
*H03B 19/00* (2006.01)

(52) U.S. Cl. ........................ 327/116; 327/113

(58) Field of Classification Search ................ 327/116, 327/119, 121
See application file for complete search history.

(56) References Cited

U.S. PATENT DOCUMENTS 6,157,335 A * 12/2000 Suzuki et al. ............... 341/154
6,246,271 B1 * 6/2001 Takada et al. ............... 327/116
6,747,489 B2 6/2004 Nasu
2008/0165465 A1 * 7/2008 Rallabandi et al. ......... 361/93.9

FOREIGN PATENT DOCUMENTS

JP 2003-198338 7/2003

* cited by examiner

*Primary Examiner*—Donovan Lincoln
*Assistant Examiner*—Daniel Rojas
(74) *Attorney, Agent, or Firm*—Volentine & Whitt, P.L.L.C.

(57) ABSTRACT

A multiplier circuit includes a bias circuit which outputs a reference voltage and a bias signal, a first delay circuit which inputs an input signal and outputs a first delayed signal according to the reference voltage and the bias signal, a second delay circuit which inputs an inversed input signal and outputs a second delay signal according to the reference voltage and the bias signal, and an OR circuit which outputs an OR logic result generated responsive to the first and second delayed signals.

2 Claims, 9 Drawing Sheets

MULTIPLIER CIRCUIT

BACKGROUND OF THE INVENTION

1. Field of the Invention

The present invention relates in general to a circuit generating a multiplied frequency, and more particularly, to multiplier circuit.

2. Description of the Related Art

A conventional multiplier circuit comprises resistors and capacitors which are easy to be influenced by temperature, voltage and production tolerance, or a PLL circuit of scale which is large and needs some external parts and lock time.

SUMMARY OF THE INVENTION

One embodiment of the present invention is a multiplier circuit that includes a bias circuit which outputs a reference voltage and a bias signal, a first delay circuit which inputs an input signal and outputs a first delayed signal according to the reference voltage and the bias signal, a second delay circuit which inputs an inversed input signal and outputs a second delay signal according to the reference voltage and the bias signal and an OR circuit which outputs an OR logic result generated responsive to the first and second delayed signals.

DETAILED DESCRIPTION OF THE PREFERRED EMBODIMENTS

Figure 1:
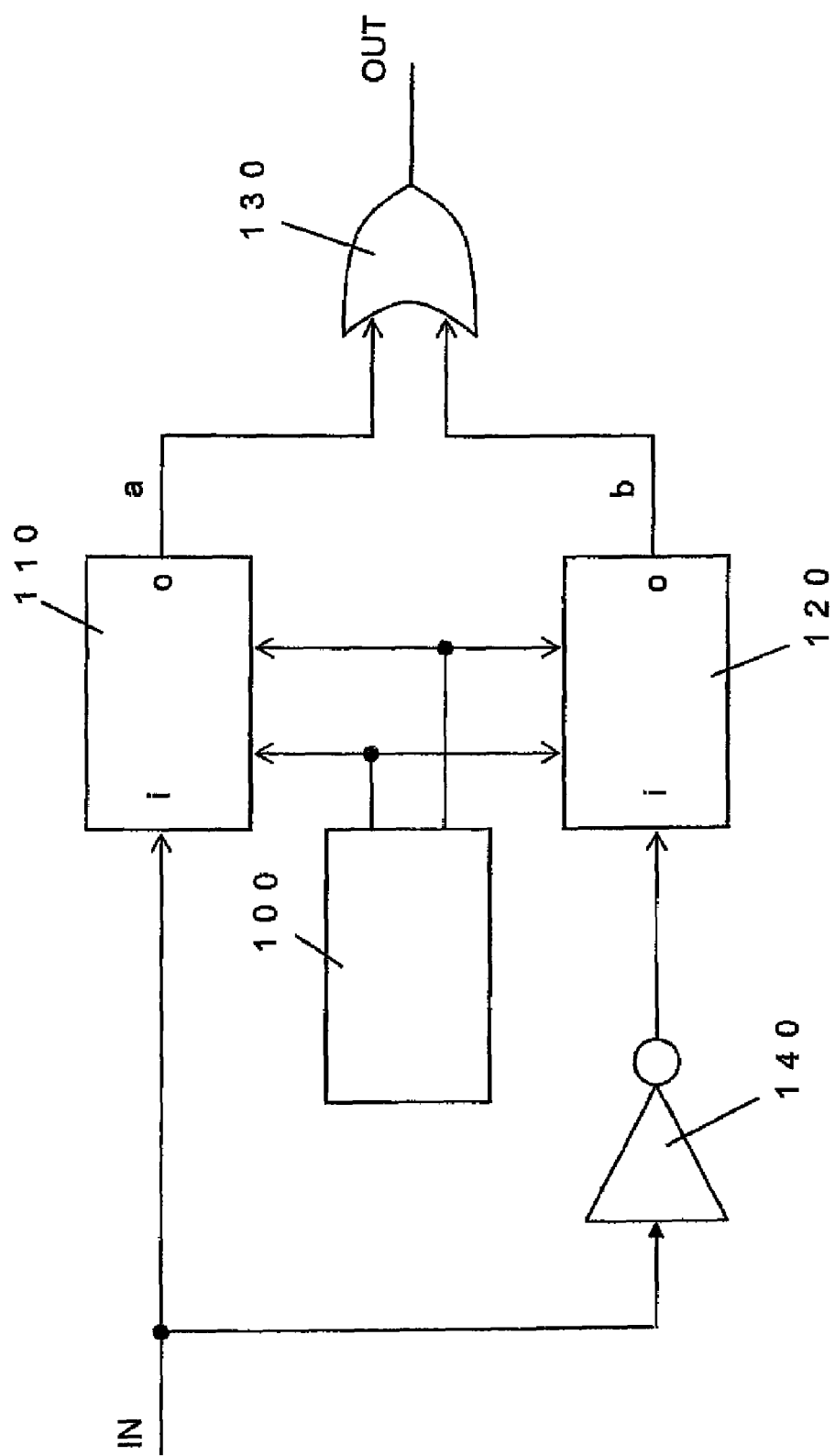
FIG. 1 is a block diagram of a multiplier circuit of the present invention.

FIG. 1 is a block diagram of a multiplier circuit of the present invention. The multiplier circuit comprises a bias circuit 100, delay circuits 110, 120, an OR circuit 130 and an inverter 140. The delay circuit 110 receives an input signal IN. The delay circuit 120 receives the input signal IN inverted by the inverter 140. The bias circuit 100 supplies the delay circuits 110, 120 with a bias signal and a reference voltage. The OR circuit 130 connects to the delay circuits 110, 120.

Figure 2:
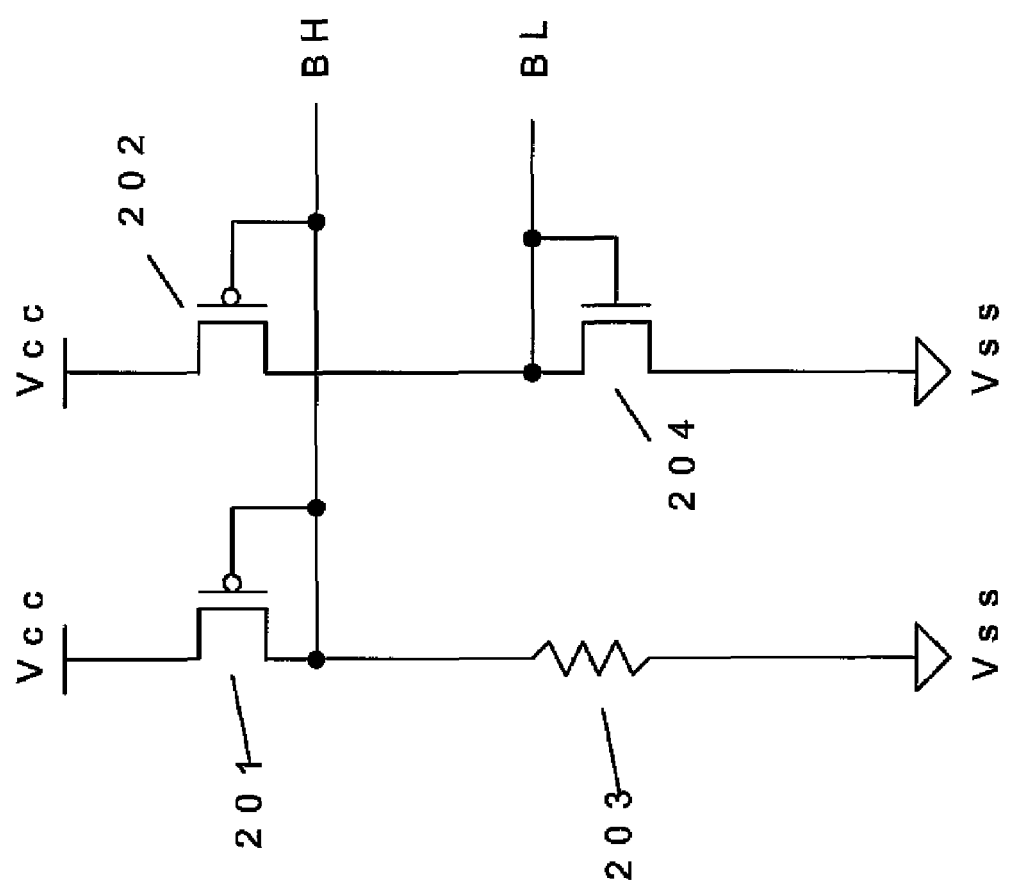
FIG. 2 is a circuit diagram of a bias generating circuit of the multiplier circuit according to a first preferred embodiment of the present invention.

FIG. 2 is a circuit diagram of a bias generating circuit of the multiplier circuit according to a first preferred embodiment of the present invention. The bias circuit 100 comprises P-type MOSFETs (hereinafter PMOS) 201, 202, a resistor 203 and an N-type MOSFET (hereinafter NMOS) 204. The control gates of the PMOS 201 and PMOS 202 are connected to a signal line BH. A control gate of the NMOS 204 is connected to a signal line BL. The PMOS 201 and the resistor 203 are connected in series between a VCC node and a VSS node. The PMOS 202 and the NMOS 204 are connected in series between the VCC node and the VSS node.

Figure 3:
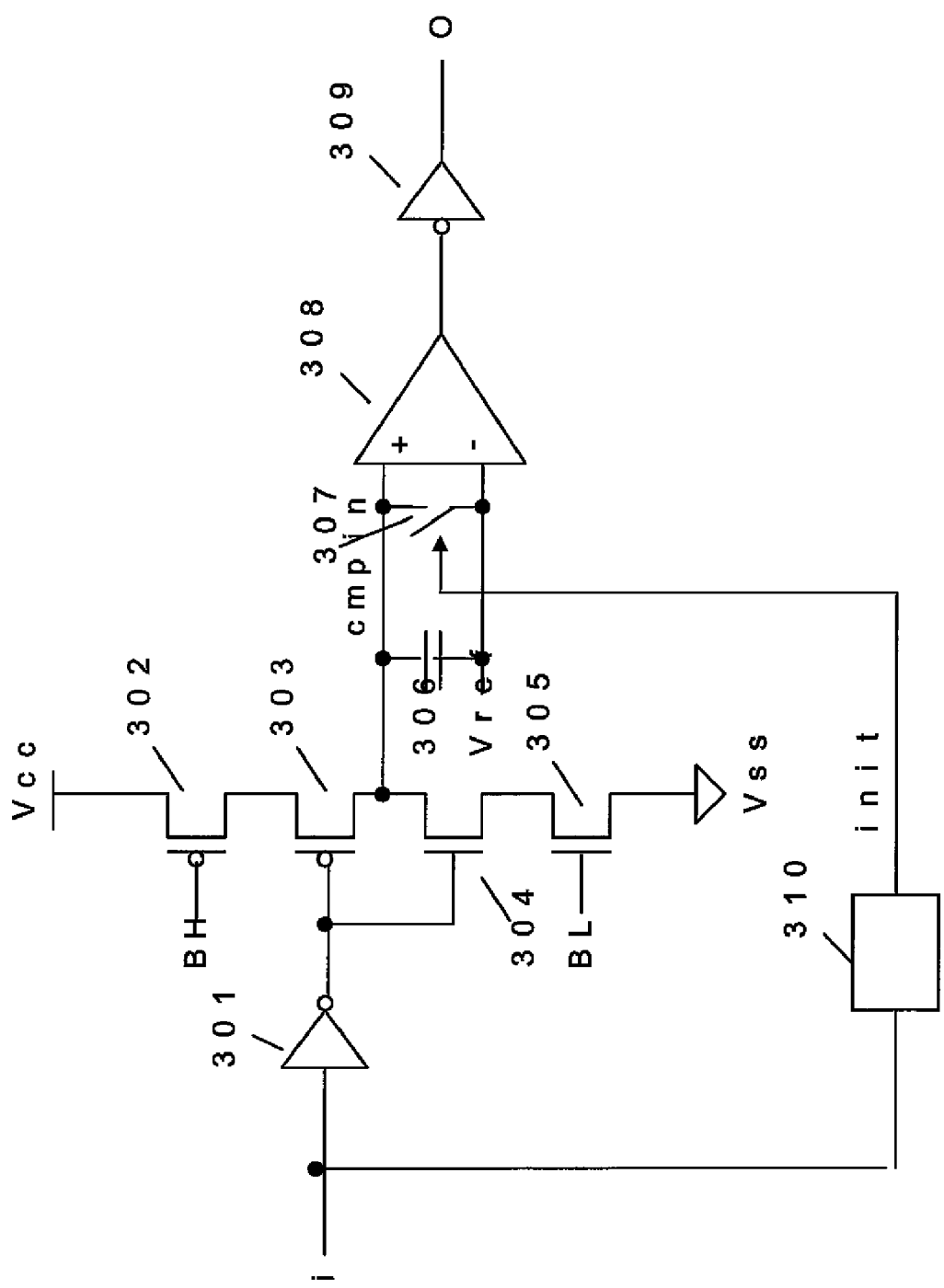
FIG. 3 is a circuit diagram of a delay circuit of the multiplier circuit according to the first preferred embodiment of the present invention.

FIG. 3 is a circuit diagram of a delay circuit of the multiplier circuit according to the first preferred embodiment of the present invention. Each of the delay circuits 110, 120 comprises an inverter 301, PMOSs 302, 303, NMOSs 304, 305, a capacitor 306, a switch 307, a comparator 308, an inverter 309 and a one-shot pulse generating circuit 310. The input terminal i is connected to the inverter 301 and the one-shot pulse generating circuit 310. The PMOSs 302, 303 and the NMOSs 304, 305 are connected in series between the VCC node and the VSS node. A control gate of the PMOS 302 is connected to the signal line BH. The control gates of the PMOS 303 and the NMOS 304 are connected to the inverter 301. A control gate of the NMOS 305 is connected to the signal line BL. The drain electrode of the PMOS 303 and the NMOS 304 are connected to the capacitor 306, the switch 307 and the comparator 308. A signal line Vref is connected to the capacitor 306, the switch 307 and the comparator 308. The comparator 308 is connected to the inverter 309. The switch 307 is controlled by the signal init output from the one-shot pulse generating circuit 310.

Figure 4:
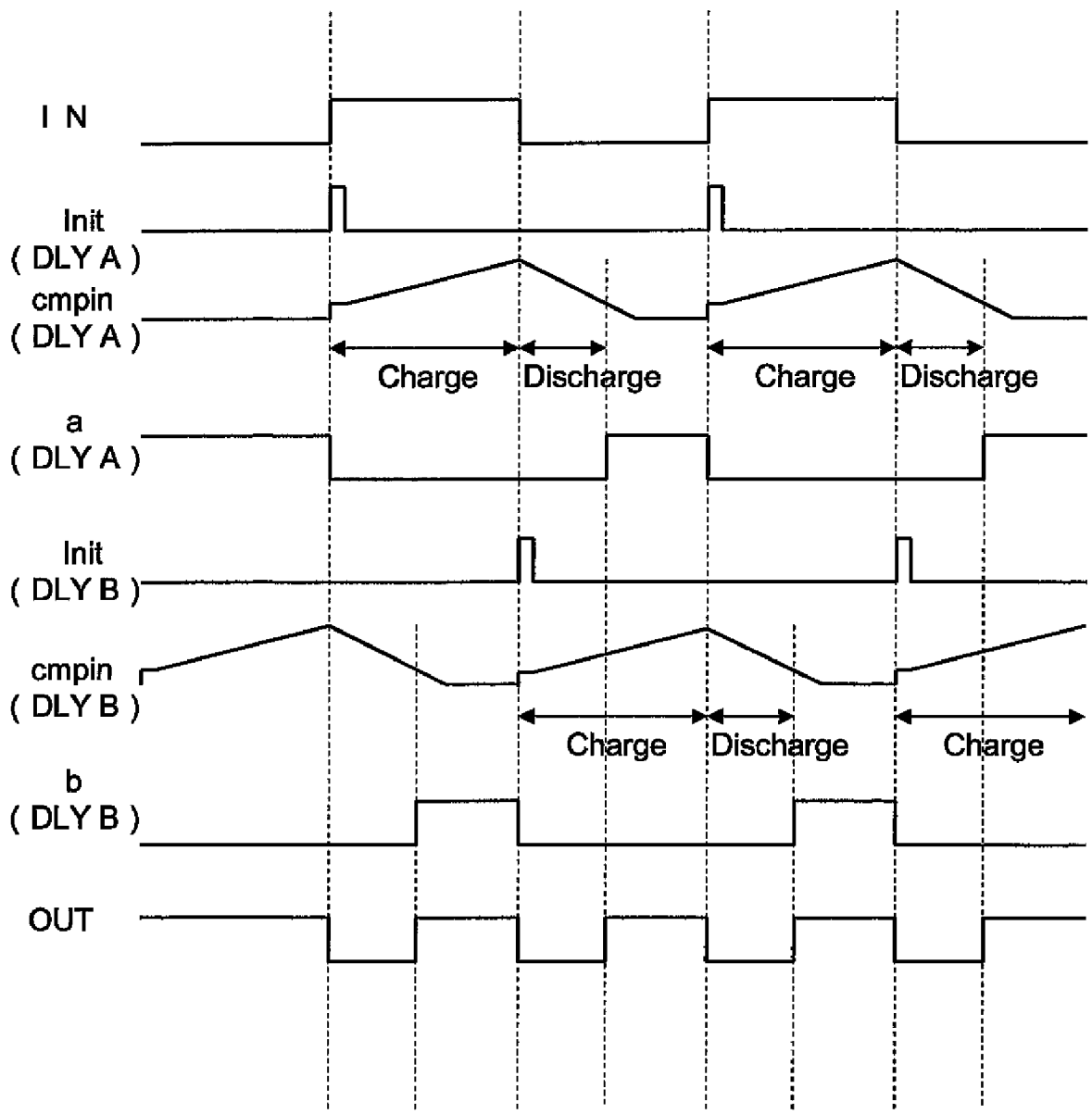
FIG. 4 is a timing chart of the multiplier circuit according to the first preferred embodiment of the present invention.

FIG. 4 is a timing chart of the multiplier circuit according to the first preferred embodiment of the present invention. When the input signal IN becomes "H level", an output init of the one-shot pulse generating circuit 310 becomes "H level" for a short time and the switch 307 is turned on. Therefore, the signal line cmpin is initialized by Vref. Next, when the output init is "L level", the capacitor 306 is charged by a constant current generated at the PMOSs 302, 303, and the voltage of the signal line cmpin roses until the input signal IN becomes "L level". An output of the comparator 308 becomes "H level" and an output a of the delay circuit 110 becomes "L level". When the input signal IN becomes "L level", the PMOS 303 becomes "OFF state" and the NMOS 304 becomes "ON state". Therefore, the capacitor 306 is discharged. The voltage of the signal line cmpin drops at the speed twice charge. When the voltage of the signal line cmpin becomes lower than the voltage Vref, the output of the comparator 308 changes from "H level" to "L level" and the output a of the delay circuit 110 changes from "L level" to "H level". When the input signal IN becomes H level again, the operation of mentioning above is repeated.

A capacitor 306 in the delay circuit 120 charges for the period of "L level" of the input signal IN and discharges for the period of "H level" of the input signal IN, because an input for the delay circuit 120 is a reversed phase.

So the OR operation with the outputs of the delay circuits 110, 120, a doubler wave for the input signal IN is obtained.

According to the multiplier circuit of the first embodiment of the present invention, the capacitor 306 is charged by a half of cycle of the input signal using a constant current and is discharged by the next half of cycle at the speed twice charging. In addition, according to the multiplier circuit of the first embodiment of the present invention, it is easy for the multiplied frequency to receive neither resistance nor the production tolerance of capacity. It only has to set the constant current value at the electrical charge and discharge small in the multiplied frequency, and capacity need not be enlarged. Therefore, an increase in the area of the chip can be suppressed. In addition, the multiplied frequency changes, too, when the input frequency changes.

Figure 5:
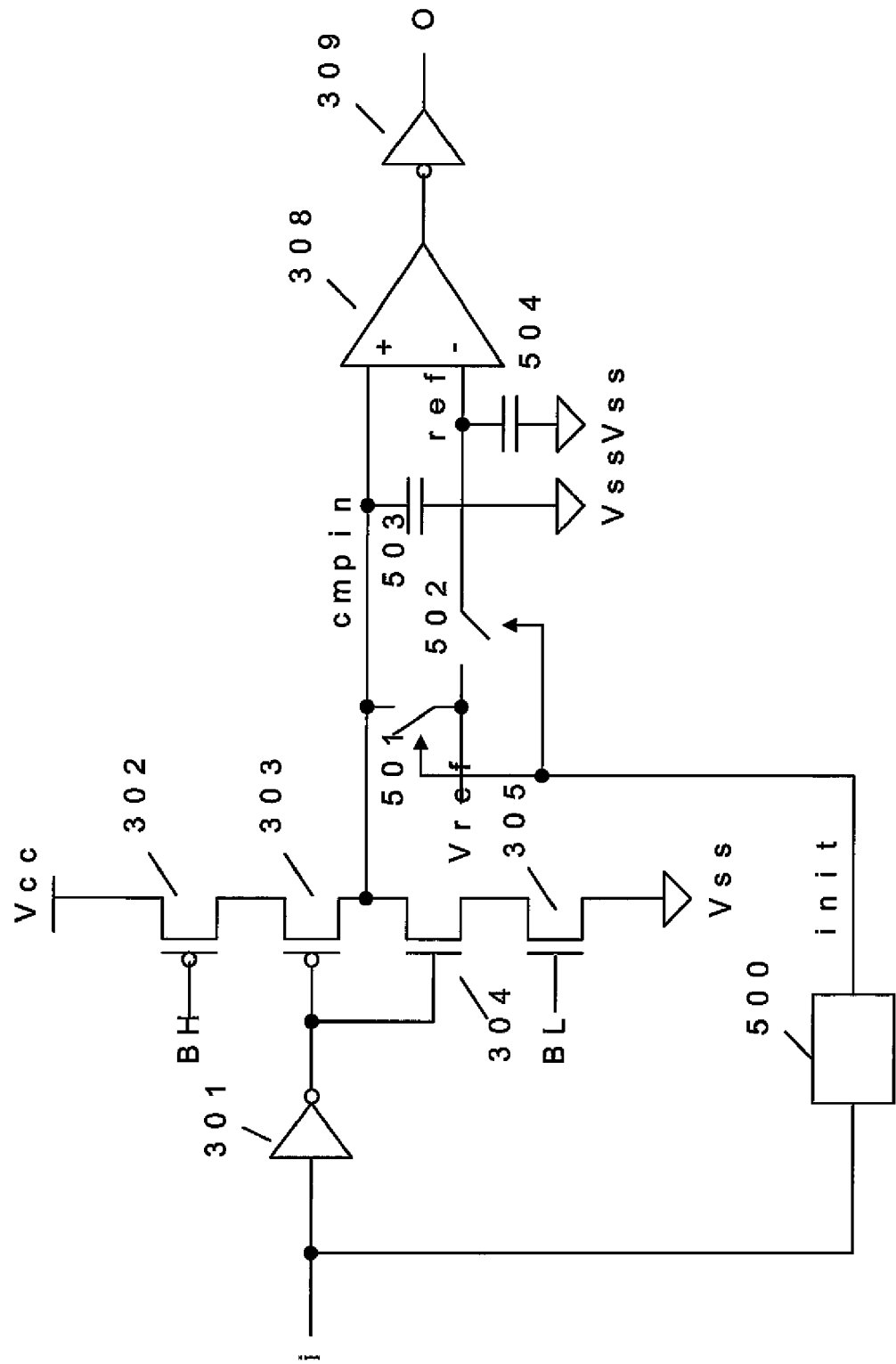
FIG. 5 is a circuit diagram of a delay circuit of the multiplier circuit according to a second preferred embodiment of the present invention.

FIG. 5 is a circuit diagram of a delay circuit of the multiplier circuit according to a second preferred embodiment of the present invention. Each delay circuit comprises an inverter 301, PMOSs 302, 303, NMOSs 304, 305, capacitors 503, 504, switches 501, 502, a comparator 308, an inverter 309 and a one-shot pulse generating circuit 500.

Figure 6:
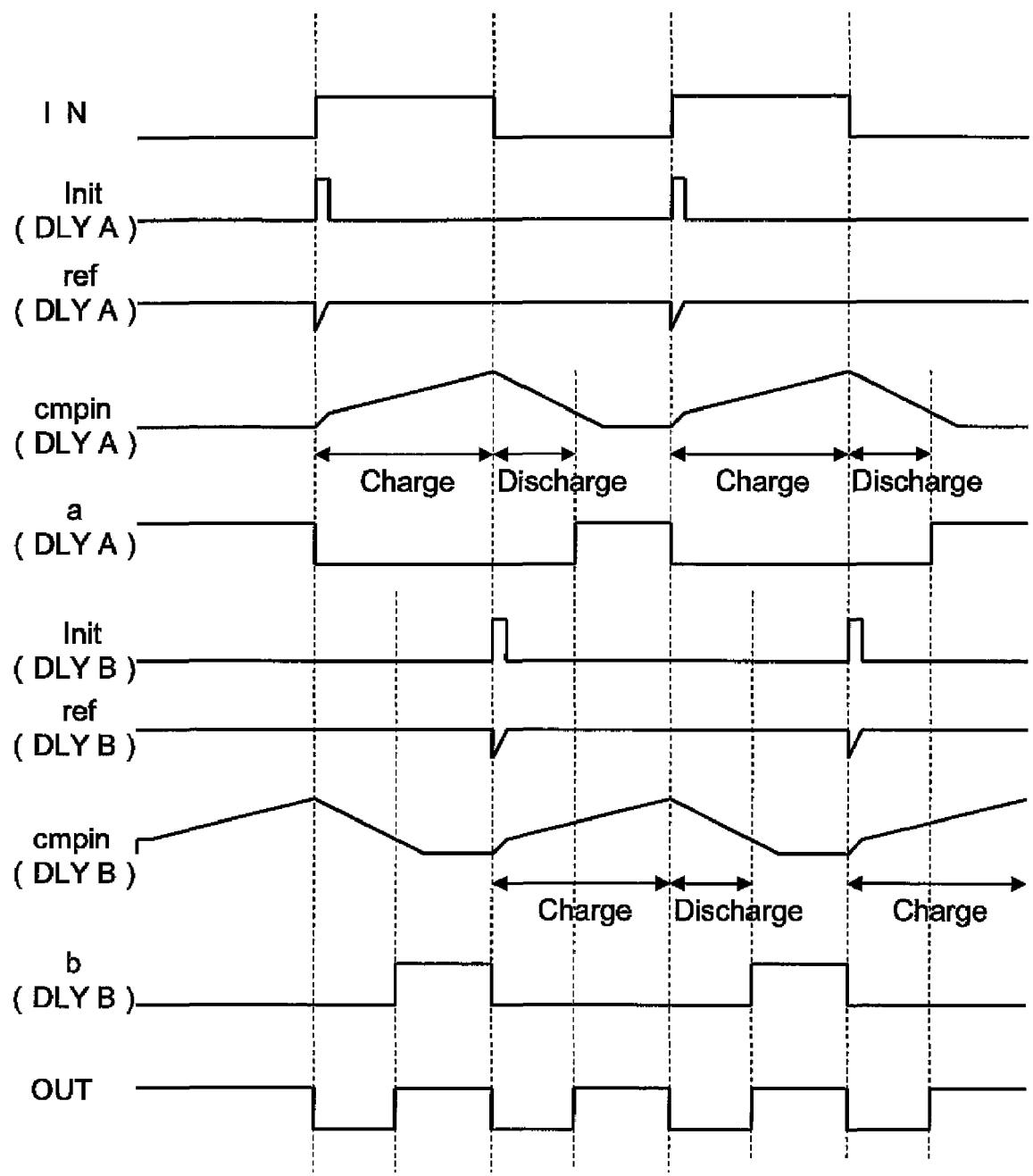
FIG. 6 is a timing chart of the multiplier circuit according to the second preferred embodiment of the present invention.

FIG. 6 is a timing chart of the multiplier circuit according to the second preferred embodiment of the present invention When the input signal IN becomes "H level", an output init of the one-shot plus generating circuit 500 becomes "H level" for a short time and the switches 501, 502 are turned on. Therefore, the signal line cmpin and ref are initialized by Vref. Next, when the output init is "L level", the capacitor 504 is separated from the signal line Vref and keeps the voltage Vref. When the output init becomes "L level", the capacitor 503 is charged by a constant current generated at the PMOSs 302, 303 and the voltage of the signal line cmpin roses until the input signal IN becomes "L level". An output of the comparator 308 becomes "H level" and an output a of the delay circuit 110 becomes "L level". When the input signal IN becomes "L level", the PMOS 303 becomes "OFF state" and the NMOS 304 becomes "ON state". Therefore, the capacitor 503 is discharged. The voltage of the signal line cmpin drops at the speed twice charge. When the voltage of the signal line cmpin becomes lower than the voltage Vref, the output of the comparator 308 changes from "H level" to "L level" and the output a of the delay circuit 110 changes from "L level" to "H level". When the input signal IN becomes H level again, the operation of mentioning above is repeated.

A capacitor 503 in the delay circuit 120 charges for the period of "L level" of the input signal IN and discharges for the period of "H level" of the input signal IN, because an input for the delay circuit 120 is a reversed phase.

So the OR operation with the outputs of the delay circuits 110, 120, a doubler wave for the input signal IN is obtained.

The multiplier circuit of the second embodiment of the present invention comprises the capacitor 504 and the switch 502 connected to the minus input terminal of the comparator 308. When the capacitor 503 is initialized by Vref and when the voltage Vref drops on the basis of a charging current for the capacitor 503, the dropped Vref voltage is kept in the capacitor 504. Therefore, the multiplied precision improves because the decrease in the voltage Vref doesn't influence.

Figure 7:
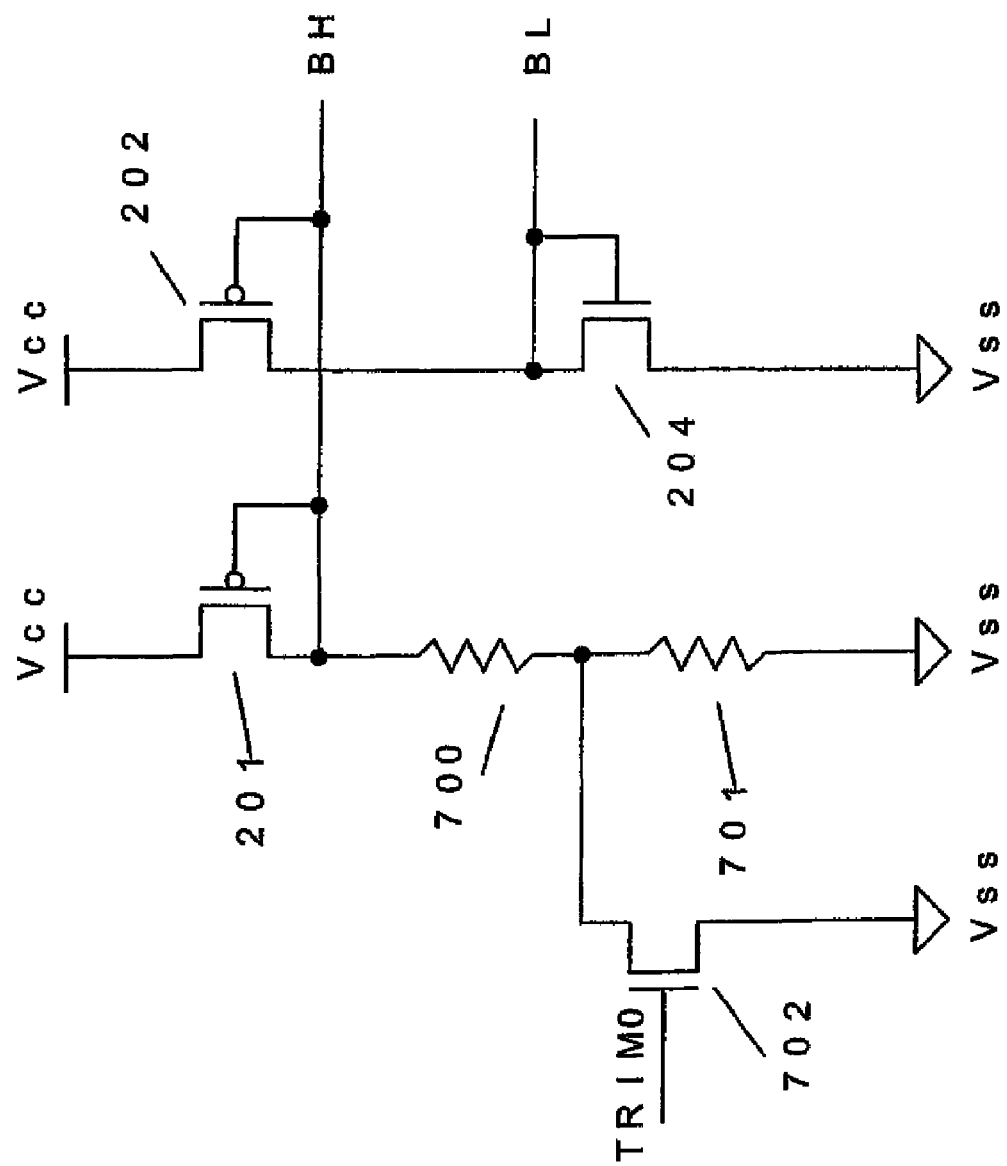
FIG. 7 is a circuit diagram of a bias generating circuit of the multiplier circuit according to a third preferred embodiment of the present invention.

FIG. 7 is a circuit diagram of a bias generating circuit of the multiplier circuit according to a third preferred embodiment of the present invention. The bias circuit 100 comprises PMOSs 201, 202, resistors 700, 701 and NMOSs 204, 702. The control gates of the PMOS 201 and PMOS 202 are connected to the signal line BH. A control gate of the NMOS 204 is connected to the signal line BL. A control gate of the NMOS 702 is connected to a signal line TRIM0. The PMOS 201 and the resistors 700, 701 are connected in series between a VCC node and a VSS node. The NMOS 702 is connected to the resistors 700, 701. The PMOS 202 and the NMOS 204 are connected in series between the VCC node and the VSS node.

Figure 8:
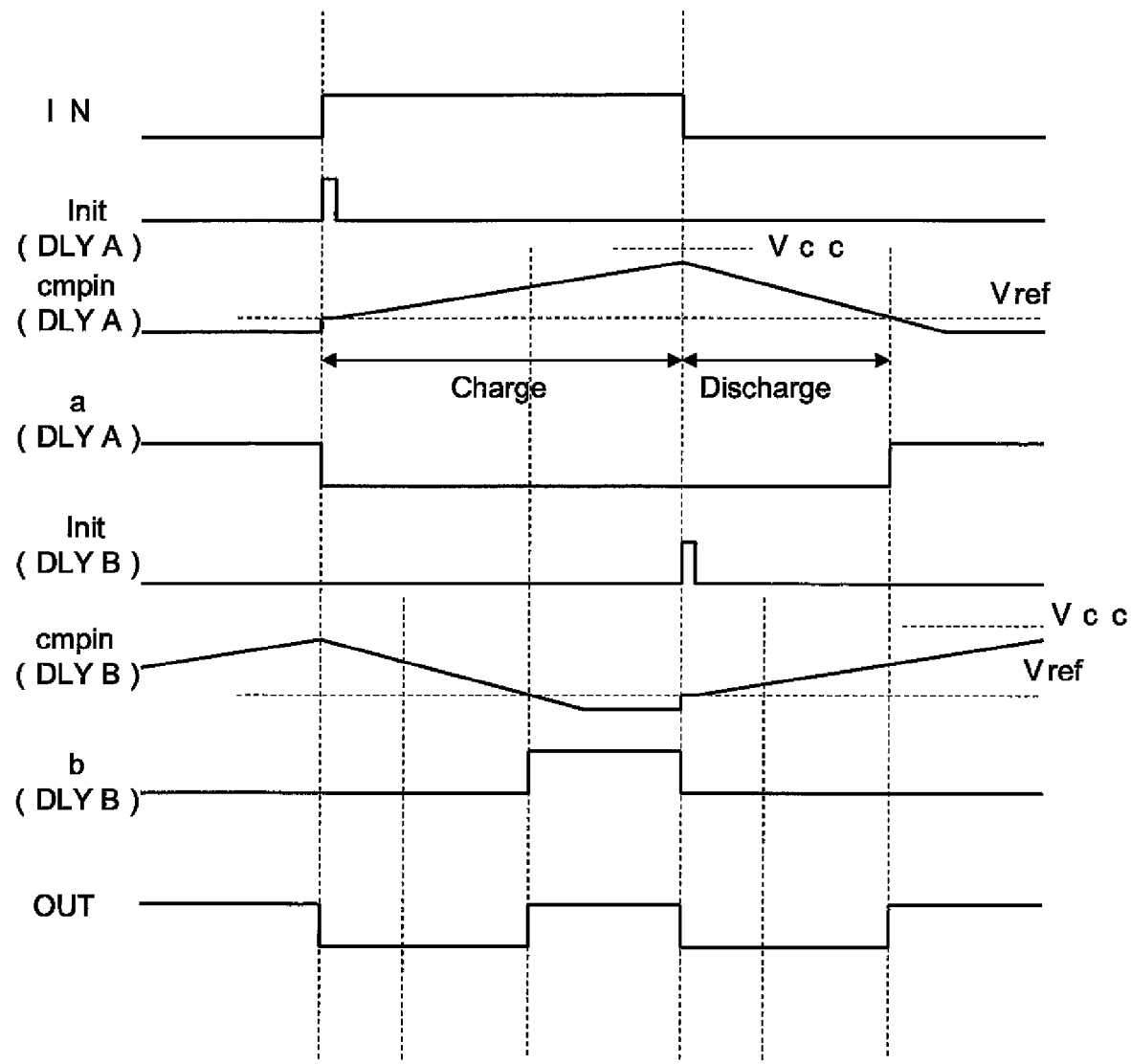
FIG. 8 is a timing chart of the multiplier circuit according to the third preferred embodiment of the present invention.

FIG. 8 is a timing chart of the multiplier circuit according to the third preferred embodiment of the present invention. When the frequency of the input signal is low, the voltage level of the signal line TRIM0 is set to "L level". Because the transistor 702 becomes "OFF state", the resistance value between the signal line BH and the VSS node is set to the sum of the resistance of the resistors 700, 701, causing the charging current and the discharging current for the capacitors 306 in the delay circuits 110, 120 shown in FIG. 3 to decrease. When the input signal IN becomes "H level", after the signal line cmpin is initialized by Vref, the charge for the period of charging is not stopped due to the decrease of the charging current though the capacitor 306 is charged by the constant current decided with the transistors 302, 303.

When the input signal IN becomes "L level", the transistor 303 becomes "OFF state" and the transistor 304 becomes "ON state", causing the capacitor 306 to be discharged by the constant current. So the voltage of the signal line cmpin decreases at the speed twice charge, the discharge ends half at charging time. Therefore, the doubled wave having a half of the duty rate for the input signal IN is obtained.

Figure 9:
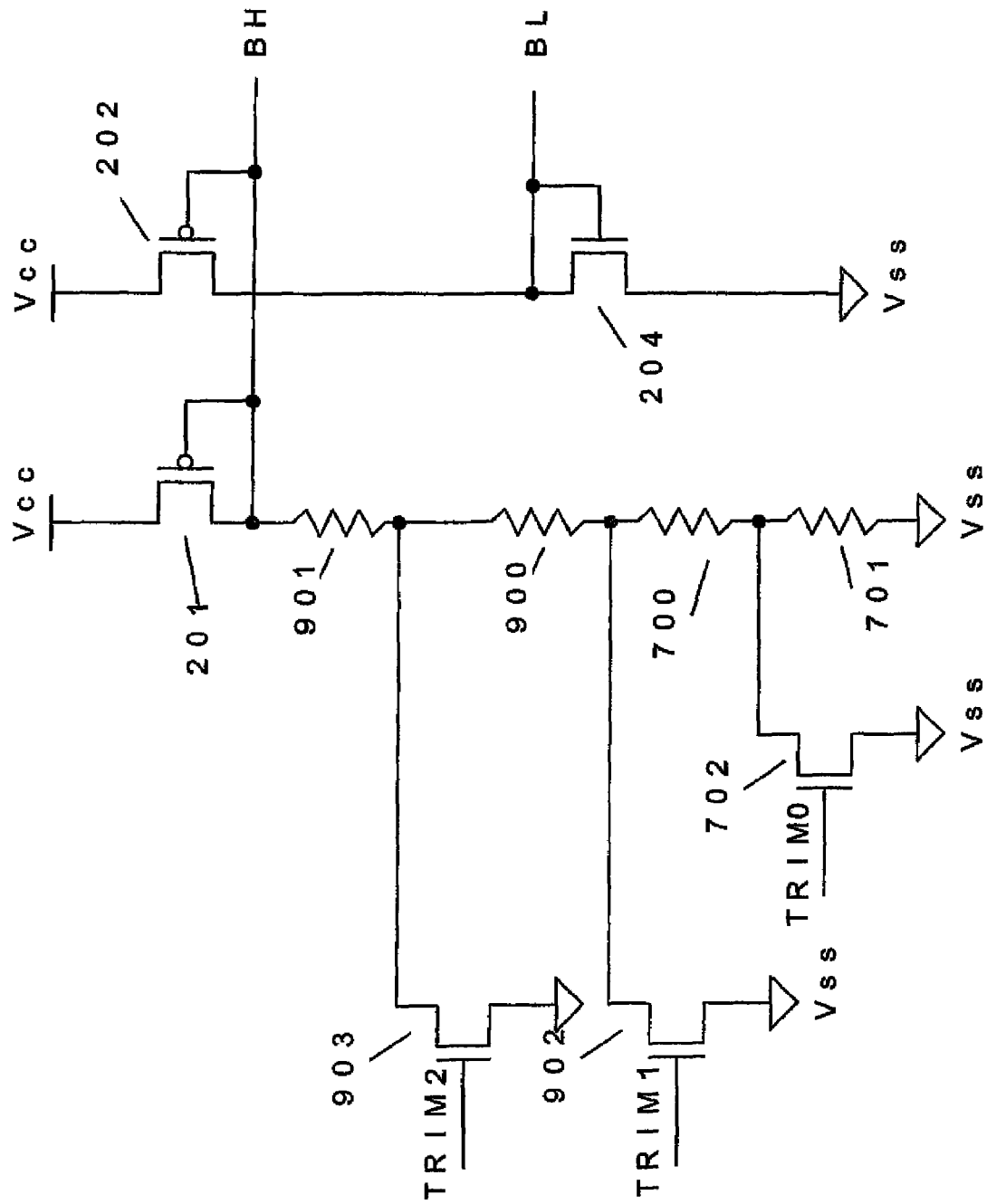
FIG. 9 is a circuit diagram of a bias generating circuit of the multiplier circuit according to a fourth preferred embodiment of the present invention.

FIG. 9 is a circuit diagram of a bias generating circuit of the multiplier circuit according to a fourth preferred embodiment of the present invention.

The bias circuit 100 comprises PMOSs 201, 202, resistors 700, 701, 900, 901 and NMOSs 204, 702, 902, 903. The PMOS 201 and the resistors 901, 900, 700, 701 are connected in series between the VCC node and VSS node. The drain of the transistor 902 is connected to the resistors 900, 700. The source of the transistor 902 is supplied with the VSS. The control gate of the transistor 902 is connected to the signal line TRIM1. The drain of the transistor 903 is connected to the resistors 901, 900. The source of the transistor 903 is supplied with the VSS. The control gate of the transistor 903 is connected to the signal line TRIM2

When the frequency of the input signal IN is low, the voltage level of the signal line TRIM0 is set to "H level" and the voltage level of the signal lines TRIM1 and TRIM2 are set to "L level". The transistor 702 becomes "ON state" and the transistors 902, 903 become "OFF state". The resistance value between the signal line BH and the VSS node becomes the sum of the resistance value of the resistors 901, 900, 700. Therefore, the charging current and the discharging current for the capacitor 306 in the delay circuits 110, 120 shown in FIG. 3 decrease more. When the frequency of the input signal IN is even lower, the voltage level of the signal lines TRIM0-TRIM2 are set to "L level". The transistors 702, 902, 903 become "OFF state". The resistance value between the signal line BH and the VSS node becomes the sum of the resistance value of the resistors 901, 900, 700, 701. Therefore, the charging current and the discharging current for the capacitor 306 in the delay circuits 110,120 shown in FIG. 3 decrease more and more. When the input signal IN becomes "H level", the signal line cmpin is initialized by Vref and the capacitor 306 is charged by the constant current decided with the transistors 201, 202. Therefore, the charge for the period of charging is not stopped due to the decrease of the charging current. When the Input signal IN becomes "L level", the transistor 303 becomes "OFF state" and the transistor 304 becomes "ON state". The capacitor 306 is discharged by the constant current. So the voltage of the signal line cmpin decreases at the speed twice charge, the discharge ends half at charging time. Therefore, the doubled wave having a half of the duty rate for the input signal IN is obtained.

According to the multiplier circuit of the fourth embodiment of the present invention, the current to cause the capacitor 306 to charge by the constant current at a half cycle of the input signal IN and the current to cause the capacitor 306 to discharge by the constant current at the speed twice charge at the next half cycle are controlled in detail. Therefore, the doubled wave having a half of the duty rate for the input signal IN is obtained according to reasonably setting the constant current for the charge/discharge.

The scope of the invention, therefore, is to be determined solely by the following claims.

What is claimed is:

1. A multiplier circuit comprising:
  a bias circuit which outputs a reference voltage and a bias signal;

a first delay circuit which has an input signal input thereto and that outputs a first delayed signal responsive to the reference voltage and the bias signal;

a second delay circuit which has an inversed input signal input thereto and that outputs a second delay signal responsive to the reference voltage and the bias signal; and an OR circuit which outputs an OR logic result responsive to the first and second delayed signals, wherein the first delay circuit includes
- an input node,
- a first inverter connected to the input node,
- a one-shot pulse generating circuit connected to the input node,
- a first PMOS transistor controlled by a first control signal,
- a second PMOS transistor connected to the first PMOS transistor in series, the second PMOS transistor being controlled by an output of the first inverter,
- a first NMOS transistor connected to the second PMOS transistor in series, the first NMOS transistor being controlled by the output of the first inverter,
- a second NMOS transistor connected to the first NMOS transistor in series, the second NMOS transistor being controlled by a second control signal,
- a capacitor connected to the second PMOS transistor, the first NMOS transistor and a reference voltage line,
- a switch that selectively electrically connects and disconnects the second PMOS transistor and the first NMOS transistor, and the reference voltage line,
- a comparator connected to the second PMOS transistor, the first NMOS transistor and the reference voltage line, and
- a second inverter connected to an output of the comparator.

2. A multiplier circuit comprising:

a bias circuit which outputs a reference voltage and a bias signal;

a first delay circuit which has an input signal input thereto and that outputs a first delayed signal responsive to the reference voltage and the bias signal;

a second delay circuit which has an inversed input signal input thereto and that outputs a second delay signal responsive to the reference voltage and the bias signal; and an OR circuit which outputs an OR logic result responsive to the first and second delayed signals, wherein the first delay circuit includes
- an input node,
- a first inverter connected to the input node,
- a one-shot pulse generating circuit connected to the input node,
- a first PMOS transistor controlled by a first control signal,
- a second PMOS transistor connected to the first PMOS transistor in series, the second PMOS transistor being controlled by an output of the first inverter,
- a first NMOS transistor connected to the second PMOS transistor in series, the first NMOS transistor being controlled by the output of the first inverter,
- a second NMOS transistor connected to the first NMOS transistor in series, the second NMOS transistor being controlled by a second control signal,
- a capacitor connected to the second PMOS transistor, the first NMOS transistor and a reference voltage line,
- a switch that selectively electrically connects and disconnects the second PMOS transistor and the first NMOS transistor, and the reference voltage line,
- a comparator having a first input node connected to the second PMOS transistor, the first NMOS transistor and a ground node, and having a second input node connected to the reference voltage line and the ground node, and
- a second inverter connected to an output of the comparator.

* * * * *